United States Patent
Kraemer et al.

(10) Patent No.: US 12,101,899 B2
(45) Date of Patent: Sep. 24, 2024

(54) ELECTRICAL ELEMENT WITH CLEARANCE-FREE FIXATION OF A PLATE MEMBER

(71) Applicants: TE Connectivity India Private Limited, Bangalore (IN); TE Connectivity Germany GmbH, Bensheim (DE)

(72) Inventors: Christoph Kraemer, Speyer (DE); Manivasakan Ravinthiran, Bangalore (IN); Pooventhan A, Bangalore (IN)

(73) Assignees: TE Connectivity Germany GmbH, Bensheim (DE); TE Connectivity India Private Limited, Bangalore (IN)

( * ) Notice: Subject to any disclaimer, the term of this patent is extended or adjusted under 35 U.S.C. 154(b) by 0 days.

(21) Appl. No.: 17/965,005

(22) Filed: Oct. 13, 2022

(65) Prior Publication Data
US 2023/0113634 A1    Apr. 13, 2023

(30) Foreign Application Priority Data
Oct. 13, 2021  (EP) .................................... 21202418

(51) Int. Cl.
*H05K 5/02*    (2006.01)
*H05K 5/00*    (2006.01)

(52) U.S. Cl.
CPC ......... *H05K 5/0221* (2013.01); *H05K 5/0013* (2013.01)

(58) Field of Classification Search
None
See application file for complete search history.

(56) References Cited

U.S. PATENT DOCUMENTS

| | | | |
|---|---|---|---|
| 7,144,258 B2 | 12/2006 | Ariga et al. | |
| 9,497,866 B2 | 11/2016 | Wakana et al. | |
| 10,236,109 B1* | 3/2019 | Robertson | F16F 7/1005 |
| 10,455,721 B2 | 10/2019 | Miura | |
| 2001/0010488 A1* | 8/2001 | Minners | H01H 61/0107 337/126 |

(Continued)

FOREIGN PATENT DOCUMENTS

| | | |
|---|---|---|
| CN | 201571290 U | 9/2010 |
| JP | 2005101088 A | 4/2005 |

(Continued)

OTHER PUBLICATIONS

Extended European Search Report, Application No. 21202418.6-1203, Dated: Apr. 4, 2022, 11 pages.

(Continued)

*Primary Examiner* — Xanthia C Relford
(74) *Attorney, Agent, or Firm* — Barley Snyder (57) ABSTRACT

An electrical element includes a plate member, a first housing part having a plate insertion section adapted to guide an insertion of the plate member along an insertion direction into a mounting position of the plate member at the first housing part, and a second housing part having a locking element forming a locking with a counter locking element of the first housing part. The second housing part has a latching element engaging a counter latching element of the plate member. The latching element and the counter latching element form a latching in an engaged state.

20 Claims, 7 Drawing Sheets

(56) References Cited

U.S. PATENT DOCUMENTS

| | | | | |
|---|---|---|---|---|
| 2007/0139842 | A1* | 6/2007 | De' Longhi | H01R 24/28 |
| | | | | 361/103 |
| 2008/0220315 | A1* | 9/2008 | Dougherty | H01M 10/6566 |
| | | | | 429/82 |
| 2009/0316368 | A1* | 12/2009 | Hiew | H05K 5/0278 |
| | | | | 361/737 |
| 2010/0164329 | A1* | 7/2010 | Heim | F04B 43/04 |
| | | | | 310/354 |
| 2014/0161617 | A1* | 6/2014 | Chatenet | F01D 5/3092 |
| | | | | 29/889.6 |
| 2014/0211921 | A1* | 7/2014 | Bandis | H01M 50/24 |
| | | | | 429/96 |
| 2016/0095235 | A1 | 3/2016 | Yang et al. | |
| 2016/0143158 | A1* | 5/2016 | Wakana | H05K 7/1418 |
| | | | | 361/752 |

FOREIGN PATENT DOCUMENTS

| | | |
|---|---|---|
| JP | 2014183139 A | 9/2014 |
| JP | 2019114687 A | 7/2019 |

OTHER PUBLICATIONS

Japanese Office Action dated Nov. 14, 2023 with English translation, corresponding to Application No. 2022-162098, 10 pages.
Korean Office Action dated May 13, 2024 with English translation, corresponding to Application No. 10-2022-0129951, 10 pages.

\* cited by examiner

ELECTRICAL ELEMENT WITH CLEARANCE-FREE FIXATION OF A PLATE MEMBER

CROSS-REFERENCE TO RELATED APPLICATIONS

This application claims the benefit of the filing date under 35 U.S.C. § 119(a)-(d) of European Patent Application No. 21202418.6, filed on Oct. 13, 2021.

FIELD OF THE INVENTION

The present invention relates to an electrical element and, more particularly, to an electrical element with a clearance-free fixation of a plate member.

BACKGROUND

Electrical elements, e.g. elements comprising or carrying at least one electrical component, are applied in various environments and may comprise a plate member supporting the electrical component. Various methods for fixing said plate member in the electric component are known. Known fixation approaches, however, are cumbersome, require several process steps, and are prone to assembly errors.

SUMMARY

An electrical element includes a plate member, a first housing part having a plate insertion section adapted to guide an insertion of the plate member along an insertion direction into a mounting position of the plate member at the first housing part, and a second housing part having a locking element forming a locking with a counter locking element of the first housing part. The second housing part has a latching element engaging a counter latching element of the plate member. The latching element and the counter latching element form a latching in an engaged state.

BRIEF DESCRIPTION OF THE DRAWINGS

The invention will now be described by way of example with reference to the accompanying Figures, of which.

DETAILED DESCRIPTION OF THE EMBODIMENT(S)

In the following, the invention will be described using exemplary embodiments, which are shown in the accompanying figures. The embodiments that will be shown merely represent exemplary embodiments of the present invention. The given technical features may be arbitrarily combined, wherein different technical features may be omitted as well, as long as the technical effect obtained with the omitted technical feature is not relevant to the present invention. All technical features having the same technical effect will be denoted with the same reference numeral. A repetitive description of already described technical features will be omitted. The described embodiments are to be understood as not limiting the scope of protection, which is defined by the claims.

Figure 1:
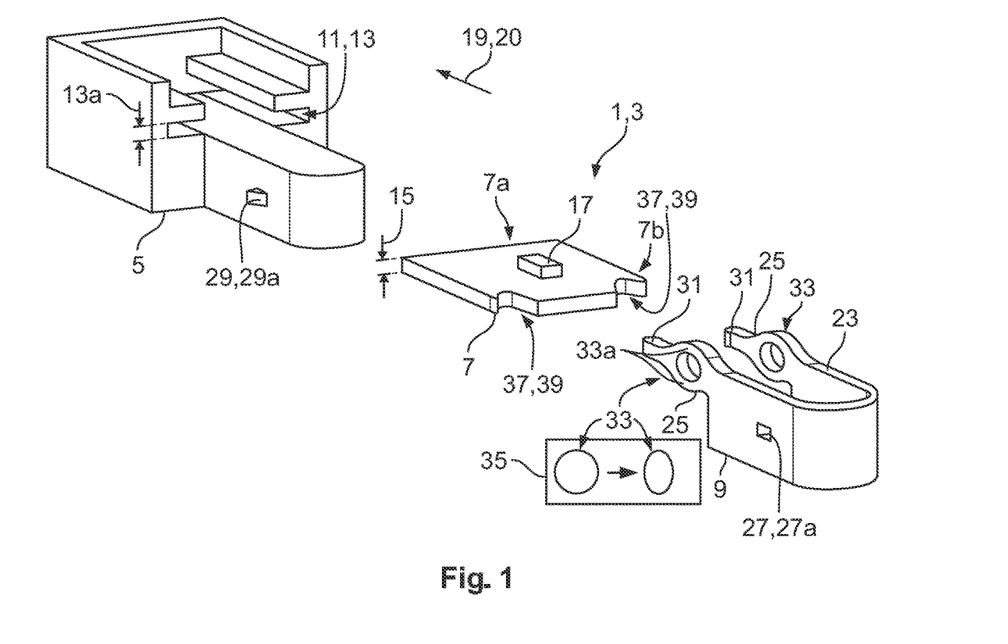
FIG. 1 is an exploded perspective view of an electrical element according to an embodiment.
Figure 2:
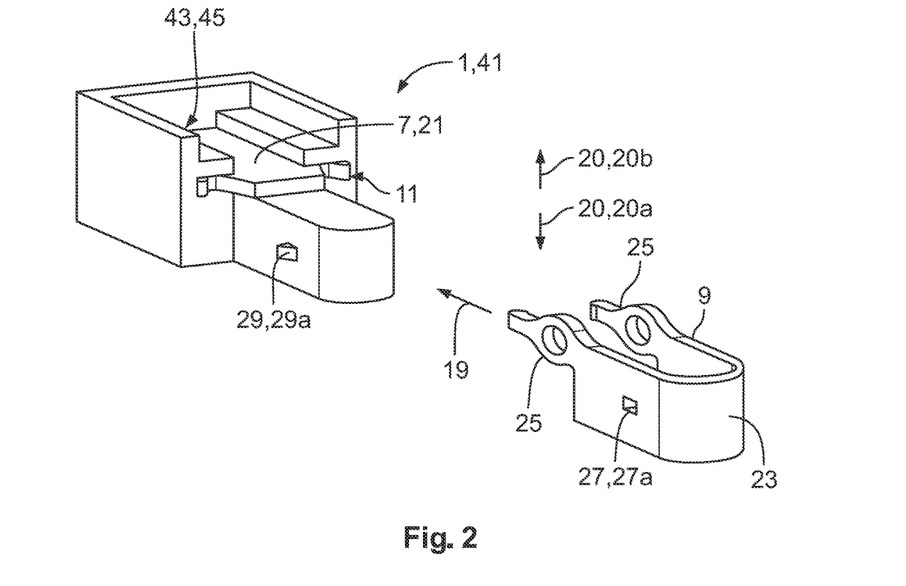
FIG. 2 is a perspective view of the electrical element in a pre-assembled state.
Figure 3:
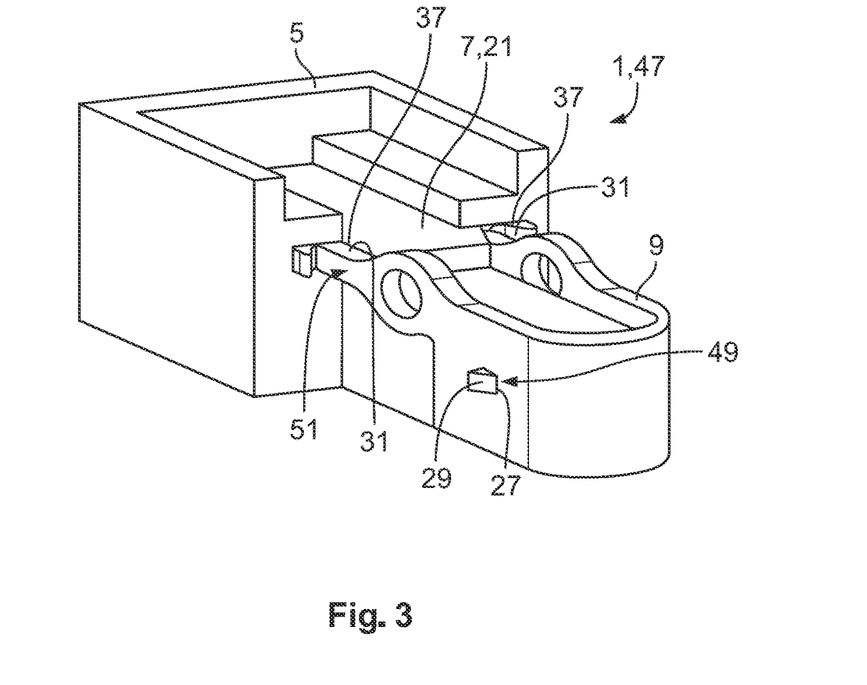
FIG. 3 is a perspective view of the electrical element in an assembled state.

In FIGS. 1 to 3, an electrical element 1 is shown in an exploded view 3. The electrical element 1 comprises a first housing part 5, a plate member 7, and a second housing part 9.

The first housing part 5 may have a cuboid or cubic shape but is not limited to those shapes and may comprise a rounded or curved outside shape.

The first housing part 5 comprises a plate insertion section 11, which is formed by a slot 13 in the embodiment shown in FIG. 1. The slot 13 has a slot width 13a corresponding or being at maximum 10% larger than a thickness 15 of the plate member 7. The plate member 7 is adapted to provide electrical components as for instance a printed circuit, a printed circuit assembly, connector elements, sensors or the like. The plate member 7 may be an electric plate member, i.e. a plate that provides an electric device or part, such as, and not limiting, a connector interface and/or any kind of sensor such as an optical sensor, temperature sensor, humidity sensor, magnetic sensor, eddy current sensor, current sensor or the like. In FIG. 1, an electrical component 17 is schematically shown and is to be understood as being representative for possible further connector elements not limited by the list given above.

The plate insertion section 11 guides an insertion of the plate member 7 along an insertion direction 19 into a mounting position 21 that is shown in FIG. 2. The insertion direction 19 may correspond to a direction of a linear movement of the second housing part 9 towards the first housing part 5. The plate member 7 has a longitudinal shape with a front side 7a and a rear side 7b, wherein the plate member 7 is inserted into the plate insertion section 11 with the front side 7a. In different embodiments of the inventive electrical element 1, a poka-yoke feature (inadvertent error prevention feature, not shown in the figures) may be provided, e.g. in the form of a cross-section of the slot 13 not showing rotational symmetry. The slot 13 and side edges of the plate member 7 may engage in a form fit that may prevent a movement of the plate member 7 relative to the slot in any direction perpendicular to the insertion direction 19, wherein a residual degree of freedom of moving the plate member in or against the insertion direction into or out of the slot may remain.

The second housing part 9, as shown in FIGS. 1 and 2, includes a body 23 and two arms 25 extending from the body 23. In the body 23, two locking elements 27 are provided. In different embodiments of the inventive electrical element 1, only one locking element 27 may be provided. The two locking elements 27 are embodied as locking recesses 27*a* and one of them is hidden by the body 23 in FIGS. 1 and 2.

The second housing part 9 has a U-shape, the base of the U being formed by the body 23.

The locking elements 27 of the second housing part 9 form a locking (see FIG. 2) with a corresponding counter locking element 29 of the first housing part 5. In the embodiment shown, the counter locking element 29 is embodied as a locking beak 29*a*.

The second housing part 9 further comprises two latching elements 31 that are provided at the arms 25. In different embodiments of the electrical element 1, the latching elements 31 may be provided at different positions and connected to the body 23 via different members. In another embodiment, only one latching element 31 may be provided. The latching elements 31 of the embodiment shown are connected and/or held to/at the body 23 by a push force member 33. The push force member 33 is compressible by deforming to ring sections 33*a* of the push force member 33, as shown in the sketch 35 below the second housing part 9.

In another embodiment, at least two latching elements 31 may be provided on one side of the second housing part 9 being connected to each other by a synchronization member that is adapted to be deflected in a direction perpendicular to the insertion direction, thereby moving the latching elements 31 provided on one side of the second housing part 9 from the stable position to the second position.

In the pre-assembly state and the assembled state, the arms 25 may at least partially surround the first housing part 5. The arms 25 of the second housing part 9 may be provided at or close to a respective further surface of the cuboid, the first surface may be oriented perpendicular to the further surface. The locking elements 27 and/or the counter locking elements 29 and/or the latching elements 31 and/or the counter latching element 37 may be provided pairwise at opposing sides of the first or second housing part 5, 9.

The latching elements 31 of the second housing part 9 engage corresponding counter latching elements 37 of the plate member 7 to engage a latching (see FIG. 3). In the embodiment shown, the counter latching elements 37 of the plate member 7 are embodied as counter latching surfaces 39.

The locking and the latching both describe fixation principles, wherein a locking, once engaged, may not be released by a force (without destruction of the elements forming the locking), whereas a latching, once engaged may be released by a force that overcomes a latching force, a latching friction or the like. Both, locking and latching, may be based on a positive fit between at least two elements. The latching may require a tool to be released. The locking may, however, also be released if locking elements are dislocated from the counter locking elements. This dislocating movement may require a tool as well.

The locking element 27, the counter locking element 29, the latching element 31, and the counter latching element 37 may be provided twice, thrice or more than three times, wherein each of the locking elements 27 has a corresponding counter locking element 29 and, accordingly, each latching element 31 has a counter latching element 37. Within this disclosure, mentioning features or functions of only one of the above elements does not exclude the presence of one or more elements having the same features or functions. Similarly, if the plural form of elements is applied, the features and/or functions described within the context of an embodiment of the electrical element comprising two locking or latching elements 27, 31 does not exclude another embodiment of the inventive electrical element 1 comprising one single locking or latching element 27, 31, one single counter locking or counter latching element 29, 37 having the same features and/or functions.

In FIG. 2, the electrical element 1 is shown in a pre-assembled state 41, in which the plate member 7 is inserted into the plate insertion section 11 along the insertion direction 19 until the mounting position 21 is reached. The mounting position 21 is defined by a stop 43 that limits the insertion of the plate member 7 along the insertion direction 19. In the embodiment shown, the stop 43 is provided by a front wall 45 of the first housing part 3.

The plate member 7 being in the mounting position 21 may thus have an outer surface accessible from outside the electrical element 1 and an inner surface facing away from the outside and not accessible therefrom. In addition or alternatively to the pocket, the electrical element 1 may comprise an internal spring pressing against the inner surface of the plate member 7, which in turn presses against guiding members 53 of the slot 13. Such an internal spring may further increase the stability and vibration resistance of the plate member 7 received and fixed in between the first and second housing part 5, 9.

In a next step during the assembly of the inventive electrical element 1, the second housing part 9 is moved along the insertion direction 19, such that the locking elements 27 of the second housing part 9 engage the counter locking elements 29 of the first housing part 5. This locking is performed such that the body 23, in particular the arms 25 of the second housing part 9 abut the locking beak 29*a* and are deflected outwards, such that an inner surface of the body 23 slides along the locking beak 29*a*, until the locking beak 29*a* reaches the locking recess 27*a*. Here, the deflected arms 25 return to their initial position shown in FIG. 1.

The insertion direction 19 may correspond to an assembly direction 20, along which the second housing part 9 is assembled to the first housing part 5. In different embodiments of the inventive electrical element 1, the assembly direction 20 may be oriented perpendicular to the insertion direction 19. Possible further assembly directions 20 are a second possible assembly direction 20*a* and a third possible assembly direction 20*b*. Further assembly directions 20 are not excluded.

In an embodiment in which the second housing part 9 is latched to the first housing part 5 along the second 20*a* or third possible assembly direction 20*b*, the locking beaks 29*a* shown in FIG. 1 and FIG. 2 may comprise a modified slope or chamfer that may at least partially face against the chosen further assembly direction 20*a* or 20*b*.

The electrical element 1 may be in an unassembled state, in which the plate member 7 is not yet received within the plate insertion section 11, and neither the locking nor the latching are engaged. The electrical element 1 may be in a pre-assembly state if the plate member 7 is received in the plate insertion section 11 and the locking is engaged. Finally, if the plate member 7 is received in the plate insertion section 11 and the locking and latching are engaged, the electrical element 1 may be in an assembled state 47.

In FIG. 3, the electrical element 1 is shown in the assembled state 47, in which the locking elements 27 form a locking 49 with the corresponding counter locking elements 29 of the first housing part 5 and, additionally, the latching elements 31 of the second housing part 9 engage a latching 51 with the counter latching elements 37 of the plate member 7. Is to be noted that the latching 51 is only possible if the plate member 7 is in the mounting position 21. If the first and second housing part 5, 9 are attached to each other along the second or third assembly direction 20*a*, 20*b*, the latching element 31 and the counter latching element 37 may be brought into engagement with each other in a sliding movement.

In order to engage the latching 51, it may be necessary that an initial barrier provided by the counter latching surface 39 is overcome. The initial barrier may result in an initial deflection force necessary to deflect the latching elements 31 in a direction opposite the insertion direction by compressing the push force member 33 in the same direction. The deflection of the latching element 31 of the second housing part 9 allows moving the latching element 31 past an edge of the counter latching surface 39, wherein the push force member 33 is at least partially released after passing said edge.

In the following FIGS. 4 to 7, another embodiment of the inventive electrical element 1 is described.

Figure 4:
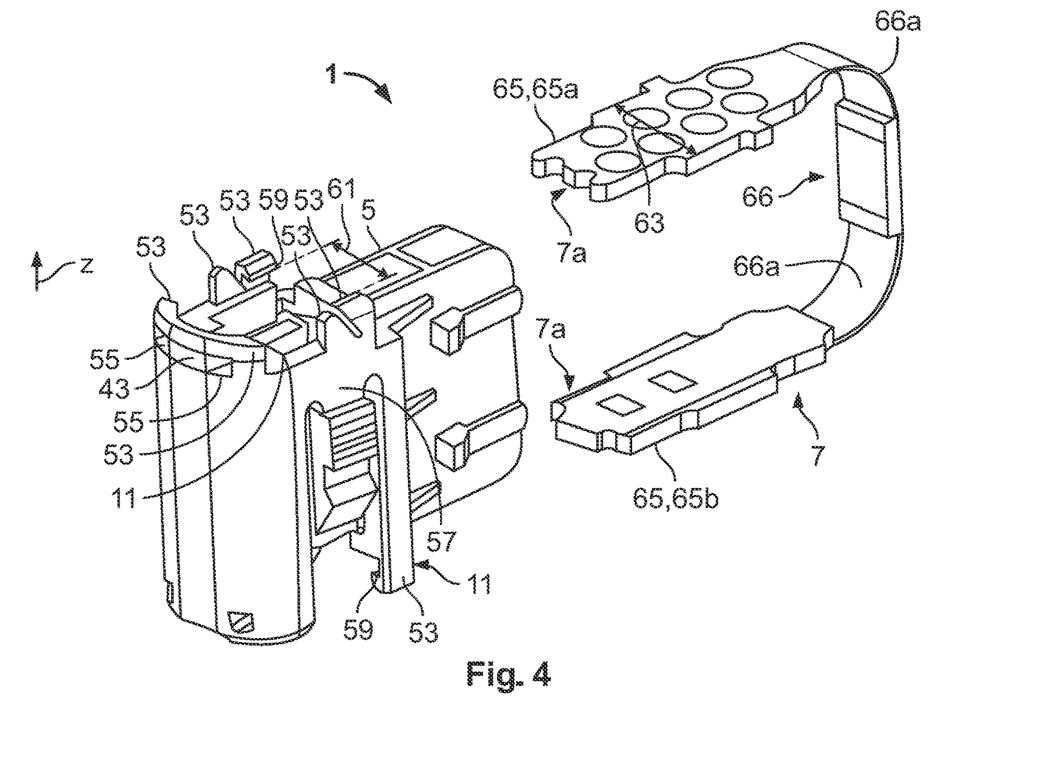
FIG. 4 is a perspective view of an electrical element according to another embodiment without a second housing part.

FIG. 4 shows the electrical element 1 without the second housing part 9.

In this embodiment, the plate insertion section 11 is formed by sectionwise arranged guiding members 53, which are spaced apart from each other along the insertion direction 19.

Further, the stop 43 additionally comprises two pockets 55 (in other embodiments, only one pocket 55 may be provided), in which a front side 7*a* of the plate member 7 may be at least partially received.

The guiding members 53 extend from a side wall 57 of the first housing part 5 and form an overhang structure 59, as shown in FIG. 4; a free space 61 between opposing overhang structures 59 is smaller than a plate width 63. The overhangs structures 59 will hold the plate member 7 in the plate insertion section 11 and prevent it from being moved out of the plate insertion section 11 in a z-direction. Along the insertion direction, the guiding members 53 may be provided only on one side or pairwise on opposing sides of the first housing part 5. Along the insertion direction, at least two guiding members 53 may be provided per side In the embodiment shown in FIG. 4, a second plate insertion section 11 is provided in a lower part of the first housing part 5. This second plate insertion section 11 is formed similarly as the upper plate insertion section 11, i.e. also with guiding members 53. The two plate insertion sections 11 may be embodied identically or different, i.e. for instance also being formed by a slot 13 as shown in FIG. 1 to FIG. 3 of the first embodiment of the inventive electrical element 1.

The plate member 7 shown in this embodiment has a U-shape and comprises two ends 65, a first end 65*a* and a second end 65*b*, which distinguish from each other by their front side 7*a* that is different to prevent incorrect mounting of the plate member 7 into the first housing part 5. Both ends 65*a* and 65*b* are connected to each other by an intermediate section 66 that may connect both ends 65 mechanically and/or electrically with each other. The plate member 7 shown may be pre-bent. The intermediate section 66 comprises two curved sections 66*a* in the embodiment shown. These curved sections 66*a* have a low relaxation and due to a thickness smaller than the thickness of the ends 65*a* and 65*b*, provide a spring behavior that will be described with reference to FIG. 6.

Figure 5:
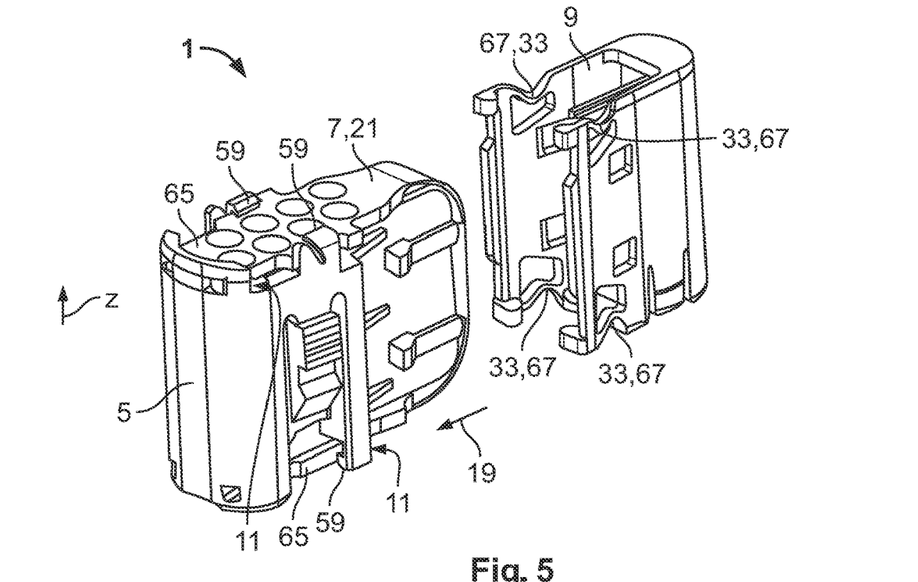
FIG. 5 is a perspective view of the electrical element of FIG. 4 in a pre-assembled state.

In FIG. 5, the plate member 7, more precisely the two ends 65 of the plate member 7, are each received within the corresponding plate insertion section of the first housing part 5. As can be seen, the overhangs structures 59 prevent the ends 56 from being moved out of the corresponding plate insertion sections 11 along, respectively opposite to the z-direction. The only remaining degree of freedom for moving the plate member 7 is opposite to the insertion direction 19.

Figure 6:
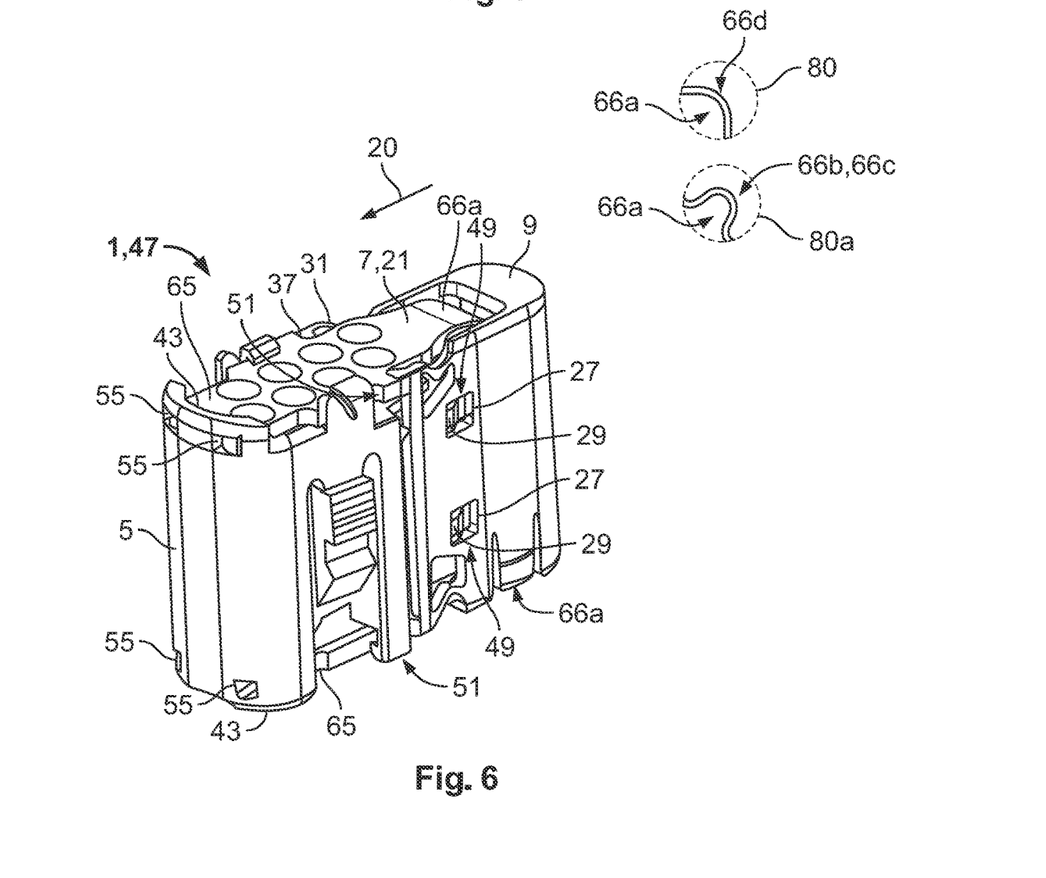
FIG. 6 is a perspective view of the electrical element of FIG. 4 in an assembled state.

FIG. 6 shows the inventive electrical element 1 in the assembled state 47. In the assembled state 47, the plate member 7 is in the mounting position 21 and partially received in pockets 55 of the stops 43. The locking 49 between locking elements 27 of the second housing part 9 and counter locking elements 29 of the first housing part 5 is engaged, in the embodiment shown, each side provides two engaged locking 49. Further, also the latching 51 is engaged between latching elements 31 of the second housing part 9 and counter latching elements 37 of the plate member 7. For each end 65 of the plate member 7, latching 51 is engaged between two latching elements 31 and two counter latching elements 37. Latching 51 will be described in more detail in FIGS. 7A-7C.

In the assembled state 47, the ends 65 of the plate member 7 are fixed and the intermediate section 66 is pressed in the assembly direction 20 by the second housing part 9. The curved sections 66*a* (see FIG. 4) act as a compressed spring 66*b* because of a deformation 66*c* thereof. The deformation 66*c* is schematically shown in a second circle 80*a* in comparison with an undeformed state 66*d* of the curved section 66*a* shown in a first circle 80. because of the curved sections 66*a* acting as compressed spring 66*b*, the plate member 7 is additionally fixed between the first housing part 5 and the second housing part 9.

With reference to FIG. 5 and FIG. 6, the push force member 33 of the second embodiment of the inventive electrical element 1 is formed by an S-shaped spring member 67. In the embodiment shown, four push force members 33 are provided, wherein in other embodiments a different number of push force members 33 is conceivable, e.g. one, two, three, five or more. In an embodiment, the push force members 33 are provided pairwise for achieving symmetric latching. The push force member 33 may have a ring-shaped or S-shaped structure or web. Further, different shapes of the push force member 33 are conceivable, for instance and not limiting an anti-S-form, a V-shape, a z-shape, an L-shape or simply a bending bar. The push force member 33 may be a flexible or elastic element with a structure similar to a meander structure.

Figure 7A:
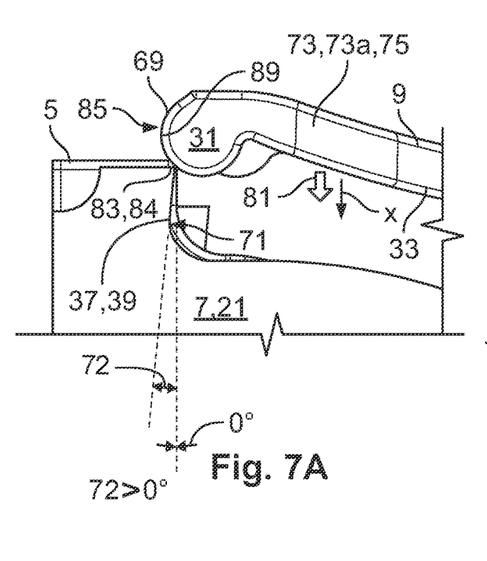
FIG. 7A is a side view of a first step of latching the electrical element.
Figure 7B:
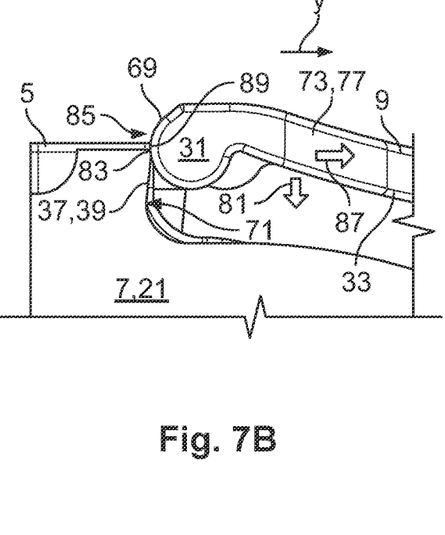
FIG. 7B is a side view of a second step of latching the electrical element.
Figure 7C:
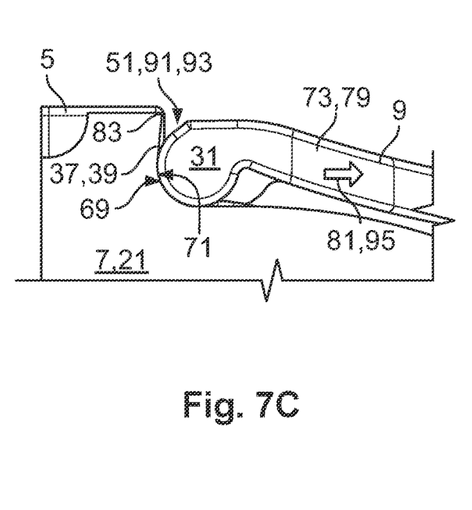
FIG. 7C is a side view of a third step of latching the electrical element.

FIGS. 7A-7C illustrates a working principle of the latching 51 and shows the latching element 31 of the second housing part 9 and the counter latching element 37 of the plate member 7 in more detail. FIGS. 7A-7C show said details in top view.

As shown in FIGS. 7A-7C, the latching element 31 has a convex surface 69 and the counter latching element 37, being a counter latching surface 39, has a concave surface 71.

The curvature of the counter latching surface 39 may be convex and a curvature of the latching element 31 of the second housing part 9 may be concave. In another embodiment of the electrical element 1, those curvatures may be inverse. Further, the shape of the surface may correspond to a 'V', a 'U', or may simply comprise a slope having a shape similar to a saw tooth. It is also conceivable that the counter latching surface 39 has the shape of a 'U' or 'V' and the latching elements 31 of the second housing part 9 having a convex curvature.

The second housing part 9 comprises a spring member 73 that connects the latching element 51 with the body 23 of the second housing part 9. In FIG. 7A, the spring member 73 is in a rest state 75 and the plate member 7 is in the mounting position 21. The spring member 73 may be a bistable spring member 73a. The rest state 75 represents the initial state of the spring member 73 without interaction with further elements or parts of the plate member 7 or to first housing part 5. The latched state may only be maintained upon interaction with a further element of the plate member 7 or the first housing part 5. The spring member 73 may be in the rest state 75 in the unassembled state of the electrical element 1 and in the pre-assembly state of the electrical element 1. In the assembled state of the electrical element 1, the spring member 73 may be in a latched state. That is, the spring member 73 is in a latched state if the plate member 7 is in the mounting position and the latching 51 is engaged. The latched state of the spring member 73 may be reached, in an embodiment, only if the plate member 7 is in the mounting position 21.

The latching 51 may be engaged by exerting a latch force 81 in an x-direction. It is noted that the latch force 81 for engaging the latching 51 of the opposing latching element 31 with the opposing counter latching element 37 is directed opposite the x-direction shown in FIG. 7A. Because of the latch force 81, the convex surface 69 of the latching element 31 abuts a corner 83 of the counter latching element 37, which, due to a curvature 85, exerts a compression force 87 in a y-direction onto the spring member 73. This compression force 87 deforms the push force member 33 as shown in sketch 35 in FIG. 1.

The corner 83 may be a touch point of locking 84. From this touch point of locking 84, the concave surface 71 spans an angle 72 larger or equal 0°, as shown in FIG. 7A.

The compression force 87, shown in FIG. 7B, is the largest when an apex 89 of the convex surface 69 surpasses the corner 83. Upon further moving, e.g. deflecting the spring member 73 in x-direction, the necessary latch force 87 as well as the generated compression force 87 decrease.

Finally, as shown in FIG. 7C, the convex surface 69 of the latching element 31 and the concave surface 71 of the counter latching element 37 engage latching 51, which may in particular be based on positive locking 91 and represent a press-fit 93.

In FIG. 7B, the spring member 73 is in an intermediate state 77, and in panel FIG. 7C, the spring member 73 is in a latched state 79. If latching 51 is engaged, i.e. the spring member 73 is moved from the intermediate state 77 to the latched state 79, an acoustic and/or haptic feedback is generated that indicates correct latching 51. Engaging the latching 51 may generate an acoustic feedback in the form of a clack sound. The engagement may further generate a shockwave that may be sensed as haptic feedback of the engagement of the latching 51.

By a remaining latch force 81, the spring member 73 holds the plate member 7 in the mounting position 21, the plate members at the stop 43 against the first housing part, wherein the residual latch force 81 is also, at least partially, exerted from the locking element 27 of the second housing part onto the counter locking element 29 of the first housing part. Thus, locking 49 as well as a latching 51 is secured by a permanent push force 95 being equal to the latch force 81 of FIG. 7C. The permanent push force 95 is smaller than the intermediate push force. This permanent push force 95 may guarantee a clearance-free lifetime fixation without the need for other fixation methods, such as e.g. gluing.

Figure 8:
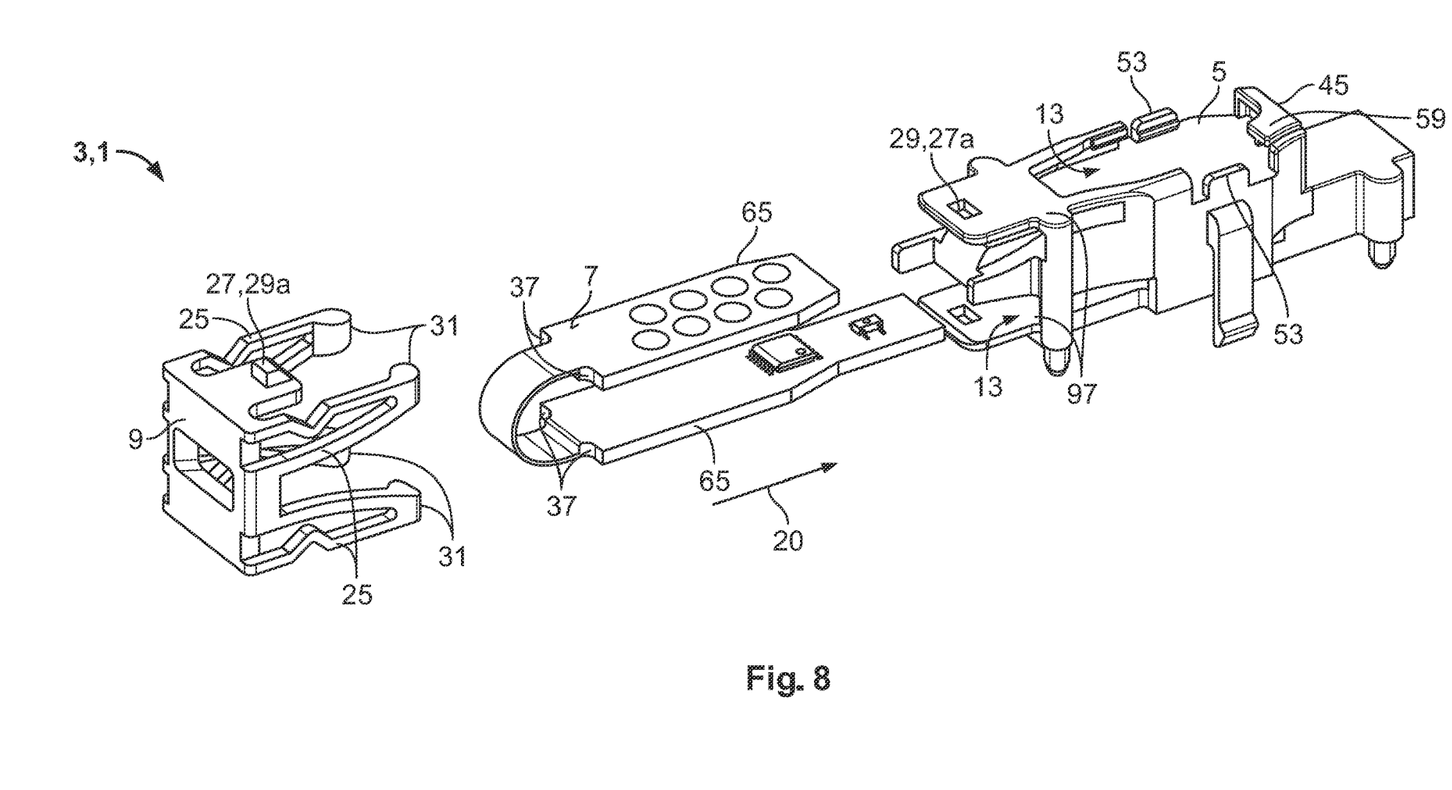
FIG. 8 is an exploded perspective view of an electrical element according to another embodiment.
Figure 9:
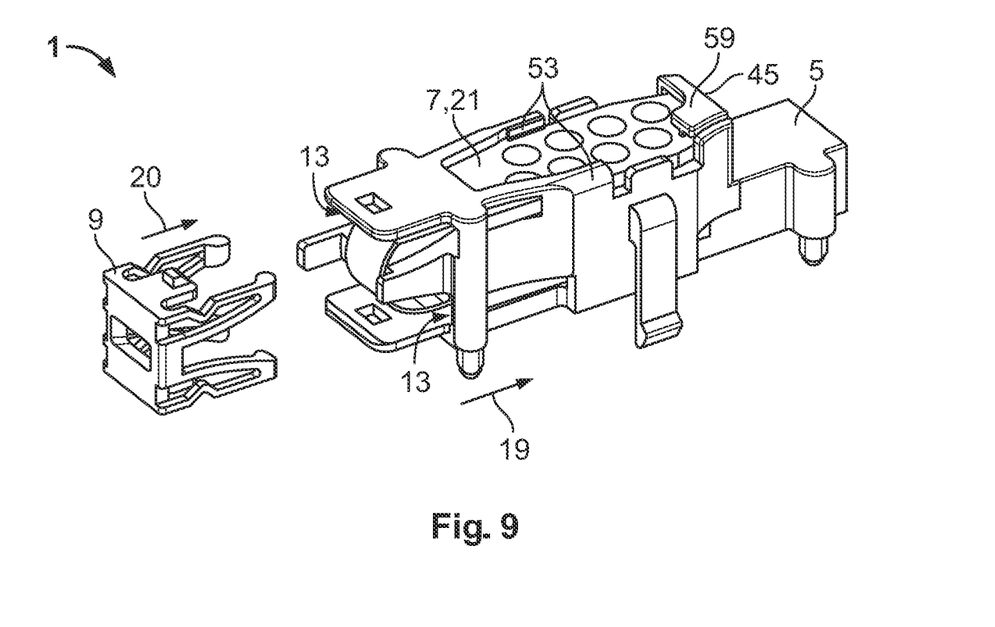
FIG. 9 is a perspective view of the electrical element of FIG. 8 with a plate member being received.
Figure 10:
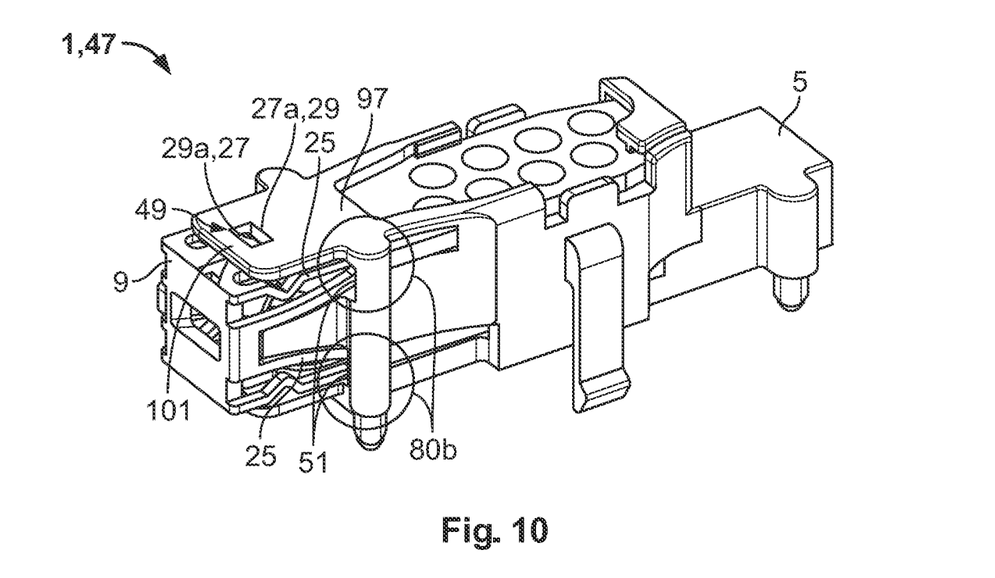
FIG. 10 is a perspective view of the electrical element of FIG. 8 in an assembled state.

In FIG. 8 to FIG. 10, another embodiment of the inventive electrical element 1 is shown. This embodiment differs from the previously shown embodiments in the shape of the first housing part 5, the plate member 7, and the second housing part 9. The plate member 7 does for instance provide ends 65 of different lengths. The other features like the arms 25 and their behavior with respect to deflection, flexibility and the like are similar to a corresponding features of the previous embodiments.

Also in the embodiment of FIGS. 8 to 10, guiding members 53 are provided that at least partially form the slots 13. In this embodiment, also the front wall 45 of the first housing part 5 comprises an overhang structure 59. Each slot 13 comprises, in addition to the guiding members 53, a roof member 97 that forms or limits the slot 13. In the embodiment shown in FIG. 8 to FIG. 10, the locking element 27 of the second housing part 9 is formed as a locking beak 29a and the counter locking element 29 of the first housing part 5 is formed as a locking recess 27a, wherein locking and counter locking elements 27, 29 are arranged in a plane perpendicular to the arrangement of the latching element and the counter latching element 31 and 37.

Because of the roof members 97 and two connecting features 99 that connect the roof members 97, the arms 25 of the second housing part and 9 may not deflect the way from the plate member 7 if the second housing part is moved in the assembly direction 20 so far that the latching elements pass the connecting features 99. The latching 51 is thus guided and no bistable locking movement of the arms 25 is necessary in this embodiment. Latching 51 and the block a movement of the arms 25 is shown in two third circles 80b in FIG. 10. The roof members 97 therefore have two functions, namely to provide a guiding for the latching elements 31 and to provide the counter locking elements 29.

In FIG. 9, the plate member 7 is in the mounting position 21, i.e. received within the slots 13 of the first housing part 5. The plate member 7 is secured by the roof member 97, the guiding members 53 and the overhang feature 59 of the front wall 45. The only remaining degree of freedom along which the plate member 7 may be moved is in or opposite to the insertion direction 19.

The second housing part 9 will subsequently be assembled to the first housing part 5 along the assembly direction 20 that corresponds to the insertion direction 19. It is noted that this embodiment does not allow assembly along the second 20a or the third possible assembly direction 20b indicated in FIG. 2.

In FIG. 10, the electrical element 1 is in the assembled state 47. The locking 49 between the locking elements 27 of the second housing part 9 and the counter locking elements 29 of the first housing part 5 is engaged. Similarly, the latching 51 is engaged. The latching elements 31 and the counter latching elements 37 are not visible in FIG. 10. In order to engage the locking 49, the roof members 97 may be resiliently deflectable away from the second housing part 9 upon approaching of a bar section 101 of the roof member 97 towards the locking beaks 29a.

Figure 11:
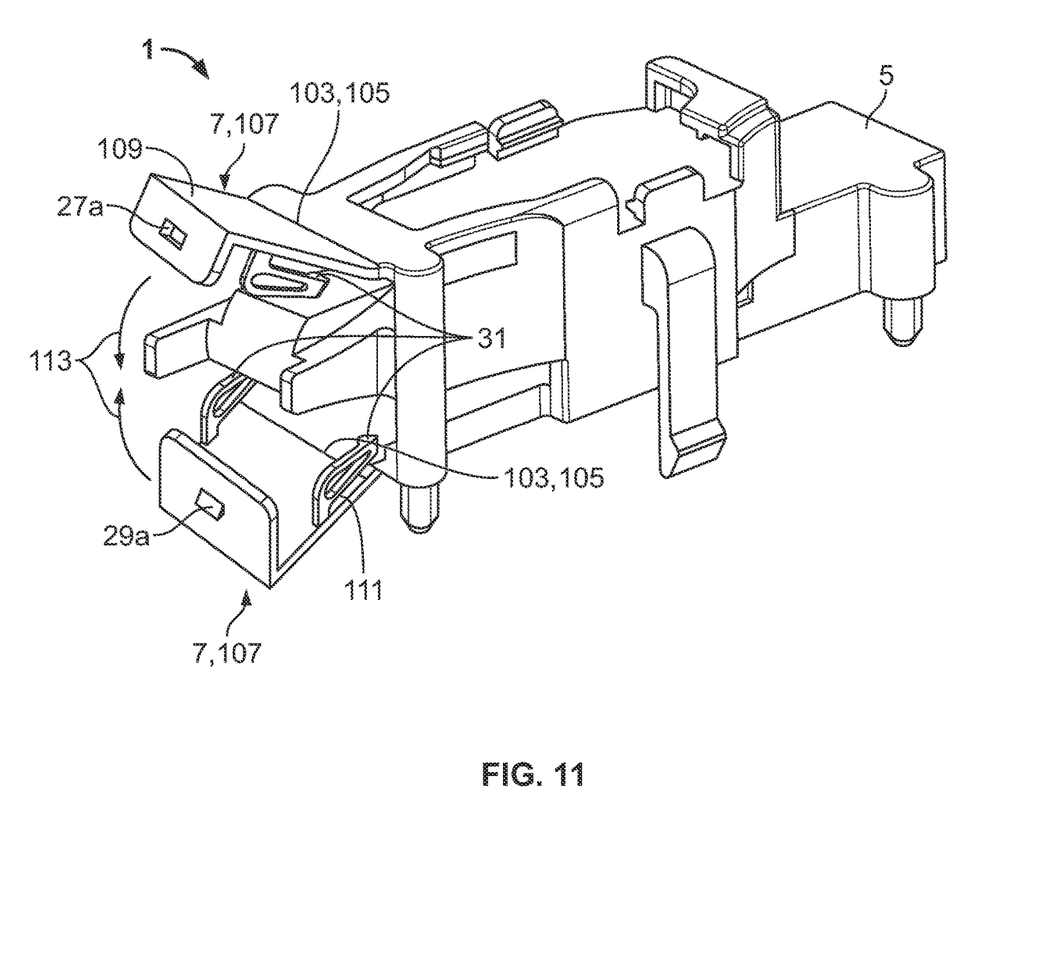
FIG. 11 is a perspective view of an electrical element according to another embodiment.

FIG. 11 shows yet another embodiment of the inventive electrical element 1, wherein the first housing part 5 is monolithically connected to the second housing part 9 by a hinge 103, in particular a film hinge 105. The second housing part 9 is thus may be understood as a functional element 107 of the first housing part 5. The functional element 107 is composed of a first functional portion 109 and a second functional portion 111, wherein the first functional portion 109 comprises a locking recess 27a and the second functional portion 111 comprises a locking beak 29a.

In the embodiment shown, each of the functional elements 107 comprise two latching elements 31. Further, FIG. 11 does not show a plate member 7 for the sake of visibility.

The embodiment of the inventive electrical element 1 of FIG. 11 may receive a plate member as shown in FIG. 8.

If a hinge is provided between the first 5 and the second housing part 9, an assembly direction may be described by a sector of a circle, indicating a tilting movement of the second housing part 9 with respect to the first housing part 5. During assembly of the electrical element 1 the functional portions 109, 111 are moved towards each other along a tilting direction 113. In case a hinge connects the first and the second housing part 5, 9, a direction of the tilting movement of the second housing part 9 with respect to the first housing part 5 may approach the insertion direction prior to the engagement of the latching. The tilting direction 113 is different for the two functional portions 109, 111. The process of receiving a plate member 7 into the first housing part 5 of the embodiment shown in FIG. 11 is similar to the process of receiving the plate member 7 as illustrated in FIG. 9.

If the first functional portion 109 and the second functional portion 111 are closed along the tilting direction 113, the resilient latching elements 31 engage their convex surface 69 with the concave surface 71 of the counter latching element 37 of the plate member (see FIG. 7C). A push force exerted by the latching elements 31 onto the counter latching elements 37 thus may help positioning the plate member 7 in the mounting position 21 (see FIG. 9). The permanent push force 95 will be exerted onto the plate member 7 over the lifetime of the electrical element 1, as in the previously described embodiments.

The inventive electrical element 1 thus has the advantage over prior art solutions that no cumbersome, difficult and time-consuming fixation is necessary. The inventive electrical element is thus easier assembled and prevents assembly errors.

The inventive electrical element 1 is clearance free, i.e. the first housing part 5 receiving the plate member 7 may be attached to the second housing part 9 without the need of gluing, screwing, hot stamping, riveting or the like, the electrical element 1 further being resistant against vibrations.

The electrical element 1 may be applied as an eBrake sensor providing detection. Some embodiments of this electrical element 1 may comprise at least one Hall sensor, provided on one end of the PCB of the plate member 7, and may further additionally or alternatively comprise contact pads for contacting the sensor on the opposite end of the PCB. The above features may be individually provided with any previously described embodiment of the inventive electric connector.

What is claimed is:

1. An electrical element, comprising:
a plate member;
a first housing part having a plate insertion section adapted to guide an insertion of the plate member along an insertion direction into a mounting position of the plate member at the first housing part; and
a second housing part having a locking element forming a locking with a counter locking element of the first housing part, the second housing part has a latching element engaging a counter latching element of the plate member, the latching element and the counter latching element form a latching in an engaged state.

2. The electrical element of claim 1, wherein the plate insertion section has a slot guiding the plate member.

3. The electrical element of claim 2, wherein the slot has a plurality of guiding members spaced apart along the insertion direction.

4. The electrical element of claim 1, wherein the plate insertion direction has a stop limiting insertion of the plate member along the insertion direction and defining the mounting position.

5. The electrical element of claim 1, wherein the latching element has a spring member.

6. The electrical element of claim 5, wherein the spring member is a bistable spring member.

7. The electrical element of claim 5, wherein the spring member is in a latched state if the plate member is in the mounting position and the latching is in the engaged state.

8. The electrical element of claim 7, wherein, in the latched state, the spring member is deflected with respect to a rest state of the spring member.

9. The electrical element of claim 1, wherein the counter latching element has a counter latching surface and, when the latching is engages, the latching element presses against the counter latching surface, pressing the plate member in the mounting position.

10. The electrical element of claim 9, wherein the counter latching surface has a curvature in or opposite to the insertion direction.

11. The electrical element of claim 8, wherein the latching element is resiliently connected to a body of the second housing part by a push force member.

12. The electrical element of claim 11, wherein the push force member holds the latching element resiliently along the insertion direction.

13. The electrical element of claim 12, wherein the spring member has an intermediate state between the rest state and the latched state.

14. The electrical element of claim 13, wherein, in the intermediate state, the push force member exerts an intermediate push force onto the plate member in the insertion direction.

15. The electrical element of claim 14, wherein the push force member exerts a permanent push force onto the plate member in the insertion direction in the latched state, the permanent push force is smaller than the intermediate push force.

16. The electrical element of claim 11, wherein the locking element is pressed against the counter locking element if the latching element is engaged with the counter latching element.

17. The electrical element of claim 1, wherein the first housing part has a pair of plate insertion sections on opposite sides of the first housing part.

18. The electrical element of claim 17, wherein the plate member is a bent plate member having a pair of ends, each of the plate insertion sections guides insertion of one of the ends of the bent plate member into the first housing part.

19. The electrical element of claim 18, wherein each of the ends of the bent plate member has the counter latching element.

20. The electrical element of claim 8, wherein the second housing part has at least two pairs of opposite latching elements, at least two of the latching elements on one side of the second housing part are connected by a synchronization member that deflects in a direction perpendicular to the insertion direction, moving the at least two latching elements on one side of the second housing part from the rest state to the latched state.

* * * * *

UNITED STATES PATENT AND TRADEMARK OFFICE
CERTIFICATE OF CORRECTION

| | |
|---|---|
| PATENT NO. | : 12,101,899 B2 |
| APPLICATION NO. | : 17/965005 |
| DATED | : September 24, 2024 |
| INVENTOR(S) | : Christoph Kraemer et al. |

Page 1 of 1

It is certified that error appears in the above-identified patent and that said Letters Patent is hereby corrected as shown below:

In the Claims

In Column 10, Line 19, Claim 9, please delete "is". Should read --the latching engages,--

Signed and Sealed this
Fifth Day of November, 2024

Katherine Kelly Vidal
*Director of the United States Patent and Trademark Office*